(12) United States Patent
Fu et al.

(10) Patent No.: US 10,788,756 B2
(45) Date of Patent: Sep. 29, 2020

(54) METHOD OF DETECTING SIZE OF PATTERN FORMED BY PHOTOLITHOGRAPHY

(71) Applicants: SHENZHEN CHINA STAR OPTOELECTRONICS TECHNOLOGY CO., LTD., Shenzhen, Guangdong (CN); WUHAN CHINA STAR OPTOELECTRONICS TECHNOLOGY CO., LTD., Wuhan, Hubei (CN)

(72) Inventors: Kuanju Fu, Guangdong (CN); Caiqin Chen, Guangdong (CN); Zhonglai Wang, Guangdong (CN)

(73) Assignee: SHENZHEN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 389 days.

(21) Appl. No.: 14/893,532

(22) PCT Filed: Aug. 18, 2015

(86) PCT No.: PCT/CN2015/087349
§ 371 (c)(1),
(2) Date: May 16, 2018

(87) PCT Pub. No.: WO2017/020348
PCT Pub. Date: Feb. 9, 2017

(65) Prior Publication Data
US 2018/0239262 A1    Aug. 23, 2018

(30) Foreign Application Priority Data
Aug. 3, 2015  (CN) .......................... 2015 1 0481969

(51) Int. Cl.
  *G03F 7/20* (2006.01)
  *G01B 21/08* (2006.01)
  (Continued)

(52) U.S. Cl.
  CPC ......... *G03F 7/70625* (2013.01); *G01B 21/08* (2013.01); *G02F 1/1362* (2013.01); *G02F 2001/136254* (2013.01); *G03F 1/44* (2013.01)

(58) Field of Classification Search
  USPC ....................................................... 702/170
  See application file for complete search history.

(56) References Cited

U.S. PATENT DOCUMENTS

| | | | | |
|---|---|---|---|---|
| 6,650,424 B2 * | 11/2003 | Brill | ....................... | G01B 15/00 250/559.19 |
| 2003/0093767 A1 * | 5/2003 | Murai | .................... | B82Y 10/00 430/30 |

(Continued)

*Primary Examiner* — Paul D Lee
(74) *Attorney, Agent, or Firm* — Soroker Agmon Nordman

(57) ABSTRACT

The present invention provides a method for detecting a size of a pattern made by photolithography, which being applied for detecting a size of a pattern formed on an array substrate of a liquid crystal display including: deriving function layer parameters and position parameters of a detection-pattern; deriving a thickness-profile of the detection-pattern according to the function layer parameters and the position parameters of the detection-pattern; deriving a plane-profile of the detection-pattern according to the thickness-profile of the detection-pattern; proceeding a size-detection to the plane-profile of the detection-pattern.

10 Claims, 3 Drawing Sheets

(51) Int. Cl.
*G02F 1/1362* (2006.01)
*G03F 1/44* (2012.01)

(56) References Cited

U.S. PATENT DOCUMENTS

| | | | | |
|---|---|---|---|---|
| 2005/0121628 A1* | 6/2005 | Aoyama | ............... | G03F 1/44 |
| | | | | 250/492.22 |
| 2007/0105029 A1* | 5/2007 | Ausschnitt | .......... | G03F 7/70691 |
| | | | | 430/30 |
| 2008/0003510 A1* | 1/2008 | Harazaki | ............... | G03F 1/68 |
| | | | | 430/5 |
| 2014/0151733 A1* | 6/2014 | Koike | ............... | H01L 33/005 |
| | | | | 257/98 |
| 2016/0070847 A1* | 3/2016 | Taguchi | ............... | G03F 1/36 |
| | | | | 716/53 |

* cited by examiner

METHOD OF DETECTING SIZE OF PATTERN FORMED BY PHOTOLITHOGRAPHY

BACKGROUND OF THE INVENTION

Field of Invention

The present invention relates to the field of detection, and more particularly to a method of detecting a size of a pattern formed by photolithography.

Description of Prior Art

As exposing patterns on an array substrate of a liquid crystal display panel is getting smaller in size, precise patterns formed by photolithography are desired to the manufacturers of the liquid crystal display panel and users.

In the conventional manufacturing process of an array substrate, inspecting a size of a photolithography pattern ensures the stability of the photolithography process. A size of each pattern of the functional layers on the actual array substrate depends on a thickness of the functional layer and adjacent-patterns. That is, the thickness of the functional layers in an area depends on the size of the patterns in the area. However, it may not accurately detect a border of an area where includes more line patterns, thereby lowering a preciseness of the detection. Therefore, manufacturing the array substrate with the conventional photolithography design pattern may result in the patterns on the array substrate differing from the original design, so the array substrate may be failed.

Hence, it is necessary to propose a method of detecting the size of the patterns formed by a photolithography process to solve the above technical problem.

SUMMARY OF THE INVENTION

An objective of the present invention is to provide a photolithography pattern size-detection method which is able to solve the technical issue of a lower display quality of the corresponding liquid crystal display panel caused by the lower detection preciseness of the size-detection method of the conventional photolithography pattern.

To achieve the above objective, the present invention provides a technical proposal as follows:

The present invention provides a photolithography pattern size-detection method, being applied for size-detection of a photolithography design pattern of a liquid crystal display panel, which comprises:

Deriving function layer parameters and position parameters of a detection-pattern;

Deriving a thickness-profile of the detection-pattern according to the function layer parameters and the position parameters of the detection-pattern;

Deriving a plane-profile of the detection-pattern according to the thickness-profile of the detection-pattern; and Proceeding a size-detection to the plane-profile of the detection-pattern.

The size-detection method further comprises:

Deriving a surrounding pattern of the detection-pattern according to the function layer parameters and the position parameters of the detection-pattern; and Deriving intervals between the detection-pattern and the surrounding pattern, and proceeding a pattern adjustment to the surrounding pattern according to the intervals.

The step of deriving a thickness-profile of the detection-pattern according to the function layer parameters and the position parameters of the detection-pattern comprises:

Proceeding an arrangement to a plurality of the detection-patterns according to a setup matrix; and Deriving the thickness-profile of the detection-pattern on a middle position of the setup matrix according to the function layer parameters and the position parameters of the detection-pattern.

In the size-detection method of the photolithography pattern of the present invention, the step of proceeding a pattern adjustment to the surrounding pattern according to the intervals further comprises:

Proceeding no pattern adjustment to the surrounding pattern while the intervals are larger than a setup value.

In the size-detection method of the photolithography pattern of the present invention, the setup value is between 2.5 micrometers and 3.5 micrometers.

In the size-detection method of the photolithography pattern of the present invention, the step of proceeding a pattern adjustment to the surrounding pattern according to the intervals further comprises:

Scaling down the surrounding pattern, in order to increase the intervals and make the intervals larger than the setup value, while the intervals are less than a setup value.

In the size-detection method of the photolithography pattern of the present invention, the setup value is between 2.5 micrometers and 3.5 micrometers.

In the size-detection method, of the photolithography pattern of the present invention, intervals among the surrounding detection-patterns correspond with intervals among surrounding pixel units of the liquid crystal display panel.

In the size-detection method of the photolithography pattern of the present invention, the setup matrix is a 3×3 matrix.

In the size-detection method of the photolithography pattern of the present invention, the setup matrix is a 9×3 matrix.

In the size-detection method of the photolithography pattern of the present invention, the step of proceeding a size-detection to the plane-profile of the detection-pattern further comprises:

Moving out the plane-profile of the detection-pattern from the photolithography pattern; and Proceeding a size-detection to the plane-profile of the detection-pattern, which is moved out.

The present invention provides another size-detection method of a photolithography pattern, being applied for size-detection of a photolithography design pattern of a liquid crystal display panel, which comprises:

Deriving function layer parameters and position parameters of a detection-pattern;

Deriving a thickness-profile of the detection-pattern according to the function layer parameters and the position parameters of the detection-pattern;

Deriving a plane-profile of the detection-pattern according to the thickness-profile of the detection-pattern; and Proceeding a size-detection to the plane-profile of the detection-pattern.

In the size-detection method of the photolithography pattern of the present invention, the size-detection method further comprises:

Deriving a surrounding pattern of the detection-pattern according to the function layer parameters and the position parameters of the detection-pattern.

Deriving intervals between the detection-pattern and the surrounding pattern, and proceeding a pattern adjustment to the surrounding pattern according to the intervals.

In the size-detection method of the photolithography pattern of the present invention, the step of proceeding a pattern adjustment to the surrounding pattern according to the intervals further comprises:

Proceeding no pattern adjustment to the surrounding pattern while the intervals are larger than a setup value.

In the size-detection method of the photolithography pattern of the present invention, the step of proceeding a pattern adjustment to the surrounding pattern according to the intervals further comprises:

Scaling down the surrounding pattern, in order to increase the intervals and make the intervals larger than the setup value, while the intervals are less than a setup value.

In the size-detection method of the photolithography pattern of the present invention, the setup value is between 2.5 micrometers and 3.5 micrometers.

In the size-detection method of the photolithography pattern of the present invention, the step of deriving a thickness-profile of the detection-pattern according to the function layer parameters and the position parameters of the detection-pattern comprises:

Proceeding an arrangement to a plurality of the detection-patterns according to a setup matrix; and Deriving the thickness-profile of the detection-pattern on a middle position of the setup matrix according to the function layer parameters and the position parameters of the detection-pattern.

In the size-detection method of the photolithography pattern of the present invention, intervals among the surrounding detection-patterns correspond with intervals among surrounding pixel units of the liquid crystal display panel.

In the size-detection method of the photolithography pattern of the present invention, the setup matrix is a 3×3 matrix.

In the size-detection method of the photolithography pattern of the present invention, the setup matrix is a 9×3 matrix.

In the size-detection method of the photolithography pattern of the present Invention, the step of proceeding a size-detection to the plane-profile of the detection-pattern further comprises:

Moving out the plane-profile of the detection-pattern from the photolithography pattern; and Proceeding a size-detection to the plane-profile of the detection-pattern, which is moved out.

Compared with the size-detection method of the conventional photolithography pattern, the size-detection method of the present invention raises the preciseness of the actual plane-pro file of the detection-pattern according to the thickness-profile of the detection-pattern, in order to raise the preciseness of size-detection, which is able to solve the technical issue of a lower display quality of the corresponding liquid crystal display panel caused by the lower detection preciseness of size-detection method of the conventional photolithography pattern.

In order to make the above description easily understood, below are embodiments with accompany drawings and a detailed explanation.

DETAILED DESCRIPTION OF THE PREFERRED EMBODIMENTS

Figure 1:
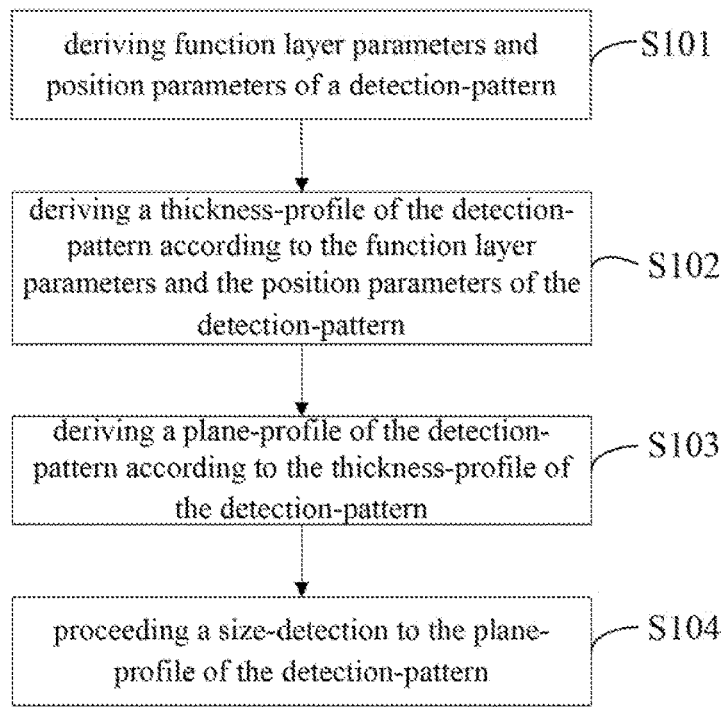
FIG. 1 is a flowchart of a first preferred embodiment of the size-detection method of a photolithography pattern according to the present invention.

As used in this specification the term "embodiment" means an instance, example, or illustration. In addition, the articles "a" or "an" as used in this specification and the appended claims in general can be interpreted as "one or more" unless specified otherwise or clear from context to be directed towards the singular form.

In the drawings, the structural similar elements are referenced by the same numerals.

FIG. 1 is a flowchart of a first preferred embodiment of the size-detection method of a photolithography pattern according to the present invention.

Step S101, deriving function layer parameters and position parameters of a detection-pattern.

Step S102, deriving a thickness-profile of the detection-pattern according to the function layer parameters and the position parameters of the detection-pattern.

Step S103, deriving a plane-profile of the detection-pattern according to the thickness-profile of the detection-pattern.

Step S104, proceeding a size-detection to the plane-profile of the detection-pattern.

Below is the actual description of the flowchart of each step of the size-detection method of the photolithography pattern of the preferred embodiment.

In step S101, a size-detection device derives function layer parameters and position parameters of a detection-pattern. The function layer parameters indicates where the detection-pattern located, such as a first metal layer used to manufacture scanning lines and gate electrodes; a second metal layer used to manufacture data lines, drain electrodes, and source electrodes; and a transparent metal layer used to manufacture pixel electrodes. The position parameters indicate an actual position of the detection-pattern in the corresponding function layer, which is able to be represented as coordinate. Then, proceeding the step S102.

Figure 2:
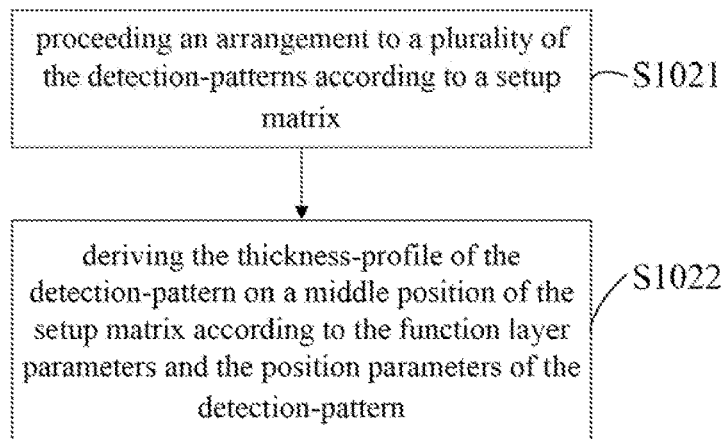
FIG. 2 is a flowchart of the step S102 of a first preferred embodiment of the size-detection method of a photolithography pattern according to the present invention.

In step S102, the size-detection device derives a thickness-profile of the detection-pattern according to the function layer parameters and the position parameters of the detection-pattern, which is derived by the step S101. Because the conventional size-detection method, doesn't consider the thickness-profile of the detection-pattern, a dimension of the detection-pattern detected is not precise. In the preferred embodiment, the interference caused by the thickness-profile of the detection-pattern can be eliminated by taking the thickness-profile as one generating factor of a detected dimension. Please refer to FIG. 2, which is a flowchart of the step S102 of a first preferred embodiment of the size-detection method of a photolithography pattern according to the present invention. The step S102 comprises:

Step S1021, proceeding an arrangement to a plurality of the detection-patterns according to a setup matrix, wherein intervals among the surrounding, detection-patterns correspond with intervals among surrounding pixel units of the liquid crystal display panel, which has a better simulation to the interference of the thickness size and plane size of the detection-pattern caused by the surrounding pixel units. Preferred, the setup matrix can be a 3×3 matrix or the setup matrix is a 9×3 matrix, an interference caused by multi-level of surrounding pixel units is considered.

Step S1022, deriving the thickness-profile of the detection-pattern on a middle position of the setup matrix according to the function Saver parameters and the position parameters of the detection-pattern. Because the detection-pattern on the middle position of the setup matrix is applied by an even interference caused by the surrounding pixel units (or detection-pattern) on different directions, then the dimensional preciseness of the detection-pattern is raised. Then, proceeding Step S103.

In the step S103, the size determination device derives a plane-profile of the detection-pattern according to the thickness-profile of the detection-pattern, which is derived by the step S102. A dimension of the plane-profile is much more precise by adding a factor of the thickness-profile into the plane-profile of the detection-pattern. Then, proceeding the step S104.

Figure 3:
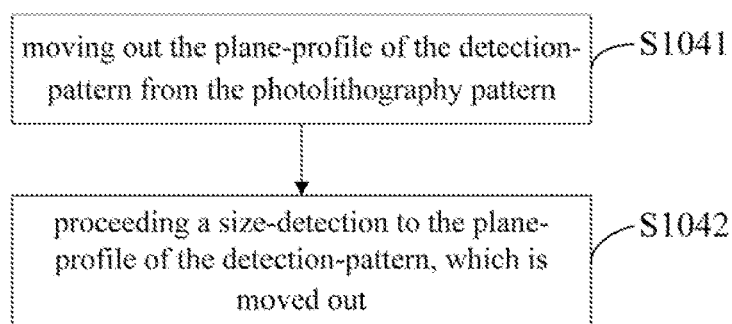
FIG. 3 is a flowchart of the step S104 of a first preferred embodiment of the size-detection method of a photolithography pattern according to the present invention.

In the Step S104, the size-detection device proceeds a size-detection to the plane-profile of the detection-pattern, which is derived by the step S103. For details, please refer to FIG. 3, which is a flowchart of the step S104 of a first preferred embodiment of the size-detection method of a photolithography pattern according to the present invention. The step S104 comprises:

Step S1041, moving out the plane-profile of the detection-pattern from the photolithography pattern.

Step S1042, proceeding a size-detection to the plane-profile of the detection-pattern, which is moved out, then interference caused by lines of the surrounding pattern could be avoided effectively, and further raise the preciseness of the detection dimension of the detection-pattern.

Then, the size-detection process of the photolithography pattern of the preferred embodiment is finished.

The size-detection method of a photolithography pattern of the preferred embodiment raises the preciseness of the actual plane-profile of the detection-pattern, by deriving the plane-profile of the detection-pattern according to the thickness-pro file of the thickness-profile.

Figure 4:
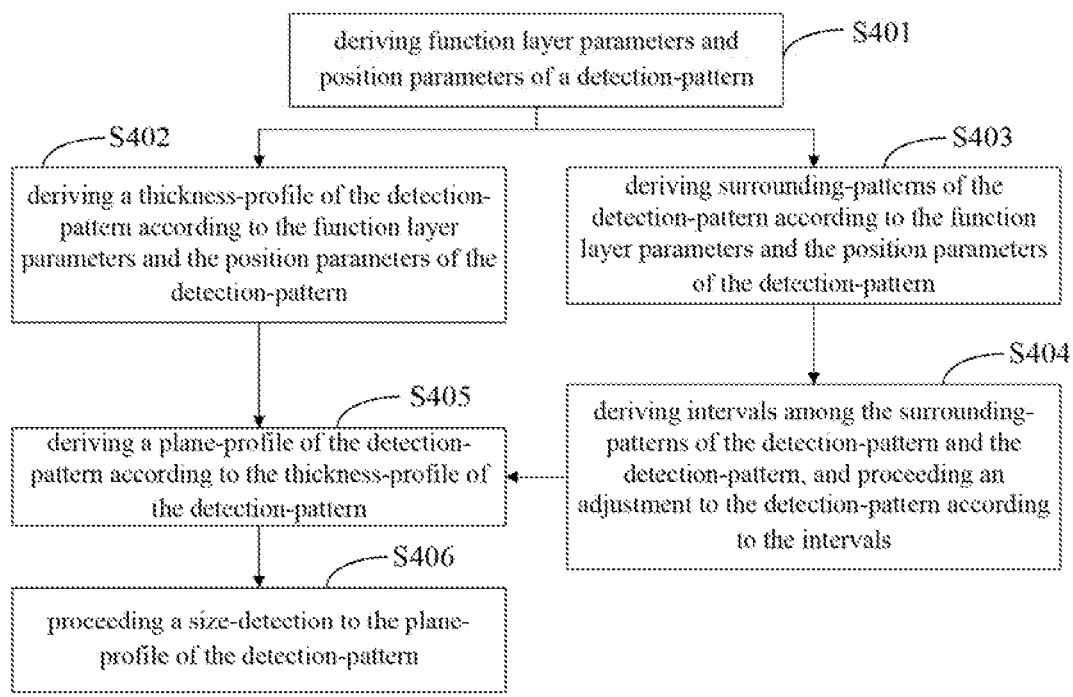
FIG. 4 is a flowchart of a second preferred embodiment of the size-detection method of a photolithography pattern according to the present invention.

Please refer to FIG. 4, which is a flowchart of a second preferred embodiment of the size-detection method of a photolithography pattern according to the present invention. The size-detection method of a photolithography pattern of the preferred embodiment comprises:

Step 401, deriving function layer parameters and position parameters of a detection-pattern.

Step S402, deriving a thickness-profile of the detection-pattern according to the function layer parameters and the position parameters of the detection-pattern.

Step S403, deriving surrounding patterns of the detection-pattern according to the function, layer parameters and the position parameters of the detection-pattern.

Step S404, deriving intervals among the surrounding patterns of the detection-pattern and the detection-pattern, and proceeding an adjustment to the detection-pattern according to the intervals.

Step S405, deriving a plane-profile of the detection-pattern according to the thickness-profile of the detection-pattern.

Step S406, proceeding a size-detection to the plane-profile of the detection-pattern.

Below is the actual description of the flowchart of each step of the size-detection method of the photolithography pattern of the preferred embodiment.

The step S401 and the step S402 are the same or similar with the step S101 and the step S102 of the first preferred embodiment of the size-detection method of a photolithography pattern according to the present invention, for details, please refer to the relative description of the step S101 and the step S102 of the first preferred embodiment of the size-detection method of a photolithography pattern according to the present invention.

In the step S403, the size-detection device derives surrounding patterns of the detection-pattern according to the function layer parameters and the position parameters of the detection-pattern, which is derived by the step S401. The surrounding patterns of the detection-pattern indicates the patterns which are surrounding the detection-pattern, the surrounding patterns might cause interference with the detection dimension of the detection-pattern. Then, proceeding the step S404.

In the step S404, the size-detection device derives intervals among the surrounding patterns of the detection-pattern and the detection-pattern, the intervals can be the minimum interval between the lines of the surrounding patterns and the detection-pattern. Then, proceeding an adjustment to the detection-pattern according to the intervals, the actual adjustment process comprises:

Confirming whether the intervals are larger than a setup value or not, the setup value is a minimum value, which will cause interference with the detection-pattern, by the surrounding pattern, in other words, while the minimum interval between the lines of the surrounding patterns and the detection-pattern is less than the setup value, an interference might be generated to the detection dimension of the detection-pattern. Preferably, the setup value is between 2.5 micrometers and 3.5 micrometers.

The surrounding patterns will not cause interference with the detection-pattern, while the intervals are larger than a setup value, then proceeding no pattern adjustment to the surrounding pattern. The surrounding patterns might cause interference with the detection-pattern, while the intervals are less than a setup value, then scaling down the surrounding pattern, in order to increase the intervals and make the intervals larger than the setup value.

Figure 5A:
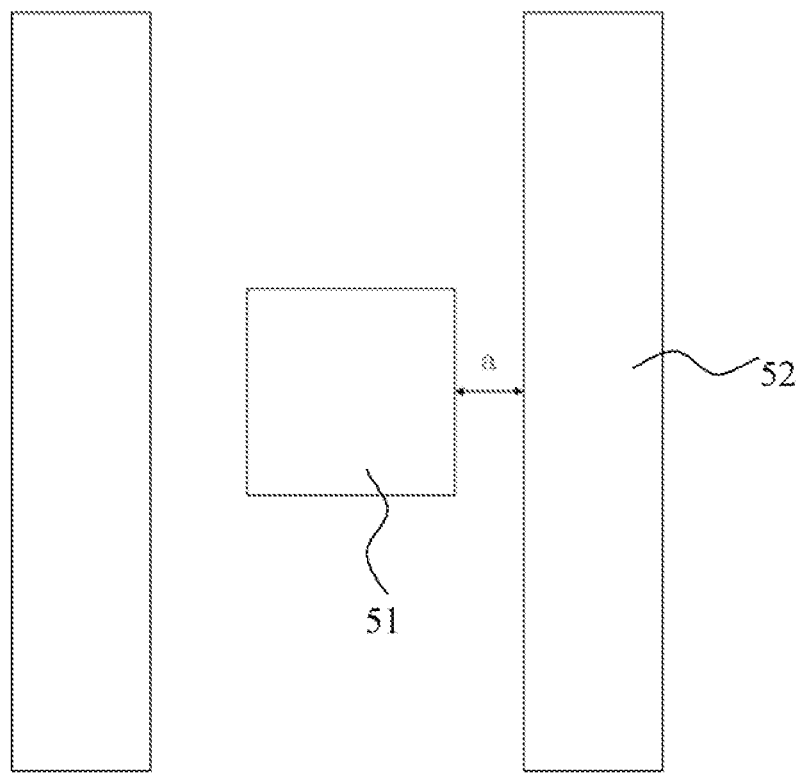
FIG. 5A is an illustrative diagram before proceeding the pattern amendment of the step S404 of a second preferred embodiment of the size-detection method of a photolithography pattern according to the present invention.
Figure 5B:
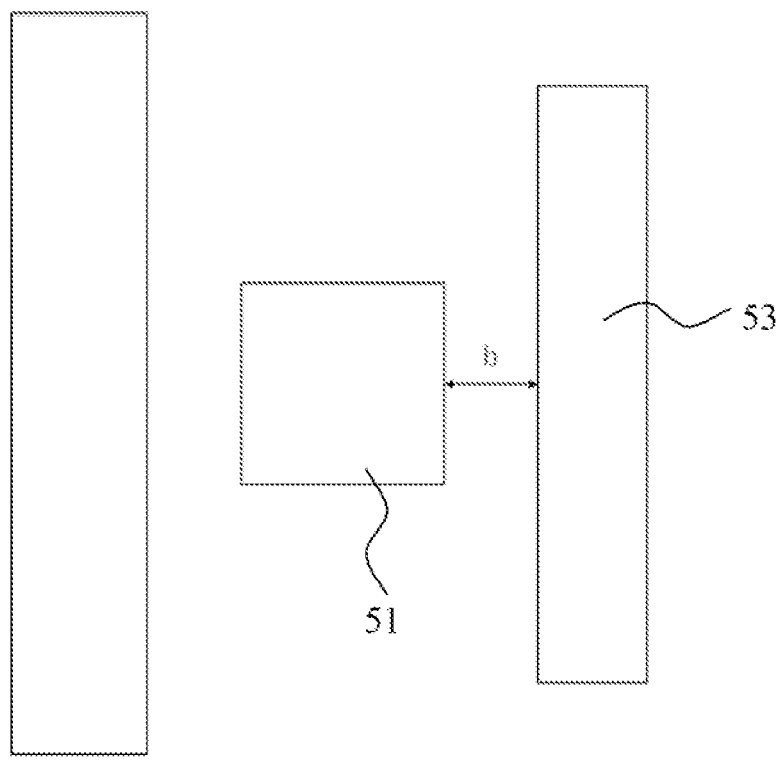
FIG. 5B is an illustrative diagram after proceeding the pattern amendment of the step S404 of a second preferred embodiment of the size-detection method of a photolithography pattern according to the present invention.

Please refer to FIG. 5A and FIG. 5B. FIG. 5A is an illustrative diagram before proceeding the pattern amendment of the step S404 of a second preferred embodiment, of the size-detection method of a photolithography pattern according to the present invention. FIG. 5B is an illustrative diagram after proceeding the pattern amendment of the step S404 of a second preferred embodiment of the size-detection method of a photolithography pattern according to the present invention. An "a" of FIG. 5A is an interval between a detection-pattern 51 and an surrounding pattern 52, the interval is less than the setup value, then it is able to scale down the corresponding surrounding pattern 52, scaling down as FIG. 5B, an interval between the detection-pattern 51 and a scaling downed surrounding pattern 53 changes to a "b", the interval is larger than the setup value, the surrounding pattern 52 will not generate interference with the detection-pattern 51 effectively. Then, proceeding the step S405.

The step S405 and the step S406 are the same as or similar to the step S103 and the step S104 of the first preferred embodiment of the size-detection method of a photolithography pattern according to the present invention, for details, please refer to the relative description of the step S103 and the step S104 of the first preferred embodiment of the size-detection method of a photolithography pattern according to the present invention.

Then, the size-detection process of the photolithography pattern of the preferred embodiment is finished.

In the foundation of the first preferred embodiment, the size-detection method of a photolithography pattern of the preferred embodiment further raises the preciseness of the actual plane-profile of the detection-pattern, by proceeding a pattern adjustment to the surrounding pattern.

The size-detection method of the present invention raises the preciseness of the actual plane-profile of the detection-pattern according to the thickness-profile of the detection-pattern, in order to raise the preciseness of size-detection, which is able to solve the technical issue of a lower display quality of the corresponding liquid crystal display panel caused by the lower detection preciseness of size-detection method of the conventional photolithography pattern.

In summary, while the present invention has been described with the aforementioned preferred embodiments, it is preferable that the descriptions relating to the above embodiments should be construed as exemplary rather than as limiting of the present invention. One of ordinary skill in the art can make a variety of modifications and variations without departing from the spirit and scope of the present invention as defined by the following claims.

What is claimed is:

1. A method for detecting a size of a detection-pattern made by photolithography, being applied for detecting a size of a pattern formed on an array substrate of a liquid crystal display and made by photolithography, comprising:
    deriving function layer parameters and position parameters of the detection-pattern;
    deriving a thickness-profile of the detection-pattern according to the function layer parameters and the position parameters of the detection-pattern;
    deriving a plane-profile of the detection-pattern according to the thickness-profile of the detection-pattern; and
    proceeding a size-detection to the plane-profile of the detection-pattern;
    the size-detection method further comprising:
    deriving a surrounding pattern of the detection-pattern according to the function layer parameters and the position parameters of the detection-pattern;
    deriving intervals between the detection-pattern and the surrounding pattern, and proceeding a pattern adjustment to the surrounding pattern according to the intervals.

2. The method according to claim 1, wherein the step of proceeding a pattern adjustment to the surrounding pattern according to the intervals further comprises:
    scaling down the surrounding pattern, in order to increase the intervals and make the intervals larger than a setup value, while the intervals are less than the setup value.

3. The method according to claim 2, wherein the setup value is between 2.5 micrometers and 3.5 micrometers.

4. The method according to claim 1, wherein intervals among the surrounding detection-patterns correspond with intervals among surrounding pixel units of the liquid crystal display panel.

5. A method for detecting a size of a detection-pattern made by photolithography, being applied for detecting a size of a pattern formed on an array substrate of a liquid crystal display and made by photolithography, comprising:
    deriving function layer parameters and position parameters of the detection-pattern;
    deriving a thickness-profile of the detection-pattern according to the function layer parameters and the position parameters of the detection-pattern;
    deriving a plane-profile of the detection-pattern according to the thickness-profile of the detection-pattern; and
    proceeding a size-detection to the plane-profile of the detection-pattern.

6. The method according to claim 5, wherein the size-detection method other comprises:
    deriving a surrounding pattern of the detection-pattern according to the function layer parameters and the position parameters of the detection-pattern;
    deriving intervals between the detection-pattern and the surrounding pattern, and proceeding a pattern adjustment to the surrounding pattern according to the intervals.

7. The method according to claim 6, wherein the step of proceeding a pattern adjustment to the surrounding pattern according to the intervals further comprises: proceeding no pattern adjustment to the surrounding pattern, while the intervals are larger than a setup value.

8. The method according to claim 7, wherein the setup value is between 2.5 micrometers and 3.5 micrometers.

9. The method according to claim 6, wherein the step of proceeding a pattern adjustment to the surrounding pattern according to the intervals further comprises:
    scaling down the surrounding, pattern, in order to increase the intervals and make the intervals larger than a setup value, while the intervals are less than the setup value.

10. The method according to claim 9, wherein the setup value is between 2.5 micrometers and 3.5 micrometers.

* * * * *

UNITED STATES PATENT AND TRADEMARK OFFICE
CERTIFICATE OF CORRECTION

PATENT NO. : 10,788,756 B2  
APPLICATION NO. : 14/893532  
DATED : September 29, 2020  
INVENTOR(S) : Kuanju Fu, Caiqin Chen and Zhonglai Wang Page 1 of 1

It is certified that error appears in the above-identified patent and that said Letters Patent is hereby corrected as shown below:

On the Title Page

Item (73), ASSIGNEE:
Delete "SHENZHEN CHINA STAR OPTOELECTRONICS TECHNOLOGY CO., LTD., Wuhan Hubei (CN)" and insert -- "SHENZHEN CHINA STAR OPTOELECTRONICS TECHNOLOGY CO., LTD.", Shenzhen, Guangdong, China and "WUHAN CHINA STAR OPTOELECTRONICS TECHNOLOGY CO., LTD.", Wuhan, Hubei, China. --.

Signed and Sealed this  
Twenty-ninth Day of June, 2021

Drew Hirshfeld  
*Performing the Functions and Duties of the*  
*Under Secretary of Commerce for Intellectual Property and*  
*Director of the United States Patent and Trademark Office*